(12) United States Patent
Biso et al.

(10) Patent No.: US 9,130,154 B2
(45) Date of Patent: Sep. 8, 2015

(54) THREE-ELECTRODE LINEAR AND BENDING POLYMERIC ACTUATOR

(75) Inventors: Maurizio Biso, Lerici (IT); Alberto Ansaldo, Genoa (IT); Davide Ricci, Genoa (IT); Giulio Sandini, Genoa (IT)

(73) Assignee: Fondazione Instituto Italiano Di Technologia, Genoa (IT)

( * ) Notice: Subject to any disclaimer, the term of this patent is extended or adjusted under 35 U.S.C. 154(b) by 336 days.

(21) Appl. No.: 13/805,243

(22) PCT Filed: Jun. 24, 2011

(86) PCT No.: PCT/IB2011/052780
§ 371 (c)(1),
(2), (4) Date: Dec. 18, 2012

(87) PCT Pub. No.: WO2011/161651
PCT Pub. Date: Dec. 29, 2011

(65) Prior Publication Data
US 2013/0093287 A1    Apr. 18, 2013

(30) Foreign Application Priority Data
Jun. 25, 2010 (IT) .............................. TO2010A0548

(51) Int. Cl.
*H01L 41/08* (2006.01)
*H01L 41/09* (2006.01)
(Continued)

(52) U.S. Cl.
CPC ............ *H01L 41/0906* (2013.01); *F03G 7/005* (2013.01); *H01L 41/09* (2013.01); *H01L 41/0926* (2013.01); *H01L 41/0986* (2013.01); *H01L 41/193* (2013.01); *B82Y 15/00* (2013.01)

(58) Field of Classification Search
USPC .................................................. 310/328, 800
See application file for complete search history.

(56) References Cited

U.S. PATENT DOCUMENTS 7,315,106 B2    1/2008  Asaka et al.
7,361,430 B1 *  4/2008  Gennett et al. ................ 429/188
(Continued)

FOREIGN PATENT DOCUMENTS

EP    1 026 192 A1    8/2000
EP     1693950 A1    8/2006

OTHER PUBLICATIONS

International Search Report for corresponding International Patent Application No. PCT/IB2011/052780 mailed Dec. 9, 2011.
(Continued)

*Primary Examiner* — J. San Matrin
(74) *Attorney, Agent, or Firm* — Merchant & Gould P.C.

(57) ABSTRACT

A polymeric actuator includes a first and a second electrode layer (2, 3), both containing electrically conductive material and able to change size in at least one direction of deformation under the action of charge injection or ion intercalation. A solid polymer electrolyte layer (4) is interposed between the first and the second electrode layer, in which the solid polymer electrolyte layer is electrically insulating and ionically conductive. The actuator is able to deform by the action of the dimensional changes of the first and second electrode layer. The actuator further includes a passive electrode (5) immersed in the solid electrolyte layer to be electrically insulated relative to the first and second electrode layer, in which the passive electrode is electrically conductive and elastically deformable material, so as to support mechanically the deformations of the actuator induced by the dimensional changes of the first and second electrode layer.

11 Claims, 3 Drawing Sheets

(51) Int. Cl.
*F03G 7/00* (2006.01)
*H01L 41/193* (2006.01)
*B82Y 15/00* (2011.01)

(56) References Cited

U.S. PATENT DOCUMENTS

| | | | |
|---|---|---|---|
| 7,449,818 B2 | 11/2008 | Kato et al. | |
| 2002/0195326 A1 | 12/2002 | Hunter et al. | |
| 2003/0069475 A1 | 4/2003 | Banik et al. | |
| 2011/0121691 A1* | 5/2011 | Ikushima et al. | 310/367 |
| 2012/0032553 A1* | 2/2012 | Goyal et al. | 310/300 |
| 2012/0235545 A1* | 9/2012 | Hino et al. | 310/365 |

OTHER PUBLICATIONS

Ding, J. et al. "High performance conducting polymer actuators utilizing a tubular geometry and helical wire interconnects", Synthetic Metals, vol. 138, 2003, pp. 391-398.

Fukushima, T. et al. "Molecular Ordering of Organic Molten Salts Triggered by Single-Walled Carbon Nanotubes", Science, vol. 300, Jun. 27, 2003, pp. 2072-2074.

Fukushima, T. et al. Fully Plastic Actuator through Layer-by-Layer Casting with Ionic-Liquid-Based Bucky Gel, Angew. Chem. Int. Ed, vol. 44, 2005, pp. 2410-2413.

Terasawa, N. et al. "Electrochemical properties and actuation mechanisms of actuators using carbon nanotubeionic liquid gel", Sensors and Actuators B, vol. 139, 2009, pp. 624-630.

Baughman, R. et al. "Carbon Nanotube Actuators", Science, vol. 284, May 21, 1999, pp. 1340-1344.

Yoon, Y. et al. "Solid-state thin-film supercapacitor with ruthenium oxide and solid electrolyte thin films", Journal of Power Sources, vol. 101, 2001, pp. 126-129.

Marrese, C. "Preparation of Strongly Adherent Platinum Black Coatings", Anal. Chem. vol. 59, 1987, pp. 217-218.

* cited by examiner

US 9,130,154 B2

THREE-ELECTRODE LINEAR AND BENDING POLYMERIC ACTUATOR

This application is a National Stage Application of PCT/IB2011/052780, filed 24 Jun. 2011, which claims benefit of Serial No. TO2010A000548, filed 25 Jun. 2010 in Italy and which applications are incorporated herein by reference. To the extent appropriate, a claim of priority is made to each of the above disclosed applications.

BACKGROUND OF THE INVENTION

The present invention relates to a polymeric actuator, comprising
- a first and a second electrode layer, both containing electrically conductive material and able to change size in at least one direction of deformation, by charge injection or ion intercalation, and
- a solid polymer electrolyte layer interposed between said first and second electrode layer, in which said solid polymer electrolyte layer is electrically insulating and ionically conductive,
- where said actuator is able to deform by the action of the dimensional changes of said first and second electrode layer.

Actuators able to generate force and displacement in response to an electrical signal are currently in use in various sectors of industry and the performance requirements are tending to be more and more diverse. A great many technologically advanced applications require actuators that are light, compact and actuated at low voltages. Moreover, it is important for said actuators to be able to effect movements easily in different directions, and moreover to be safe and easy to manipulate.

There has recently been increasing interest in organic actuators that can be deformed by an electrical signal. Many of said actuators are light and are able to operate in a gaseous environment, for example in the atmosphere. An example of said actuators is described in U.S. Pat. No. 7,315,106, which relates to an actuator of the type defined at the beginning. This actuator is composed of carbon nanotubes, a non-volatile ionic liquid and a polymer. Although this type of actuator is simple to manipulate and can be used in a gaseous environment, its laminar shape limits its directions of bending, as is described in U.S. Pat. No. 7,449,818.

Polymeric actuators with a tubular geometry have recently been reported. "High performance conducting polymer actuators utilizing a tubular geometry and helical wire interconnects" [1] describes a tubular electromechanical actuator based on polypyrrole with helical wire interconnects. Although the helical wire interconnects permit efficient charge injection/extraction without mechanical or electrochemical degradation of the system, this type of actuator does not allow a free choice of the directions of bending.

Polymeric actuators were recently proposed that can operate in air and in vacuum using an active layer composed of carbon nanotubes and an ionic liquid. The actuator comprises a conductive material (a gel composition of carbon nanotubes and ionic liquid), an electrode layer (comprising the conductive material and a polymer) and an ionically conductive layer (comprising an ionic liquid and a polymer). The conductive material displays good conductivity and good extensibility/contractility. The particular structure of said actuator makes it possible to use low operating voltages and it is stable both in air and in vacuum. Moreover, the production process is simple and makes it possible to obtain an actuator of extremely small dimensions suitable for a wide range of applications.

For example, a gel (called bucky gel [2]) prepared using single-walled carbon nanotubes (SWCNT) ground with ionic liquids (IL) based on imidazole was used for making a three-layered bendable actuator with an inner layer of ionic liquid electrolyte supported by polymer, interposed between electrode layers of bucky gel [3]. These actuators in gel have many favourable characteristics: they can operate in air for a long time without liquid electrolyte and require low voltages (3-4 V), the deformation is about 1% and the operating frequency greatly exceeds those obtainable with actuators based on carbon nanotubes that operate in a liquid environment. Moreover, they can be made easily by techniques of casting, rolling, moulding and spraying. The actuation of actuators based on nanotubes has been explained by effects of steric repulsion due to transfer of ions to the electrode [4] and by charge injection [5] which leads to a change in length of carbon-carbon bond of the nanotubes. As a result of charge injection, one of the electrodes expands while the other contracts or expands less than the other one, and in a three-layered configuration this produces the bending movement of the actuator.

The arrangement of a certain number of electrodes around a bar-shaped ionically conductive layer enables the actuator to perform complex bending and peristaltic movements.

U.S. 2002/195326 describes another actuator of the type defined at the beginning, comprising a first and a second electrode layer, both containing electrically conductive material, in particular polypyrrole, able to change size under the action of charge injection, and a layer of solid polymeric electrolyte, in particular a PMMA gel, interposed between the first and second electrode layer.

The existing devices designed for reproducing complex movements require a large number of units of polymeric actuators arranged in a predetermined configuration connected with particular mechanical and electronic requirements, to obtain bending and peristaltic movements in said actuator structure.

SUMMARY OF THE INVENTION

The aim of the invention is to provide a polymeric actuator that permits both flexural and linear actuation on applying a low voltage.

In view of this aim, the invention relates to an actuator of the type defined at the beginning, further comprising a passive electrode immersed in the solid electrolyte layer so as to be electrically insulated relative to said first and second electrode layer, in which said passive electrode is of electrically conductive and elastically deformable material, such that it mechanically complies with the deformations of the actuator induced by the dimensional changes of said first and second electrode layer, where said actuator is able to assume different configurations of deformation in response to respective configurations of polarization of said first and second electrode layer and passive electrode.

The actuator according to the invention can perform bending, linear deformation, or a combination of these deformations simply by polarizing two of the electrodes, or all three, in various configurations of polarization. While the first and second electrode layers actively determine the deformation of the actuator, the inner passive electrode deforms elastically so as to follow said deformation.

BRIEF DESCRIPTION OF THE DRAWINGS

Further characteristics and advantages of the actuator according to the invention will become clear from the detailed description that follows, referring to the appended drawings, supplied purely as a non-limiting example, in which.

DETAILED DESCRIPTION OF THE PREFERRED EMBODIMENTS

Figure 1:
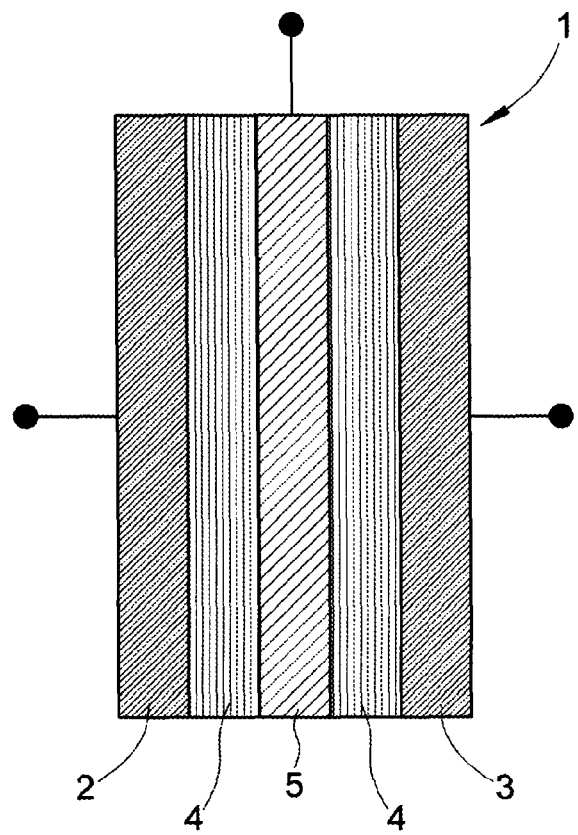
FIG. 1 is a schematic representation of an actuator according to the invention.

Referring to FIG. 1, a polymeric actuator is illustrated schematically, designated as a whole with 1.

The actuator 1 comprises a first and a second electrode layer 2, 3, both containing electrically conductive material, and both able to change size in at least one direction of deformation under the action of charge injection or ion intercalation. In particular, the direction of deformation of the electrode layers 2, 3 is substantially perpendicular to the direction of stratification, i.e. to the direction of arrangement of the various layers of actuator 1. Actuator 1 is therefore able to deform under the action of the combination of dimensional changes of the first and of the second electrode layer 2, 3.

Preferably, to avoid asymmetric behaviour of the actuator at equal electrical supply, and accordingly of injected charge of the electrodes, the first and the second electrode layer 2, 3 are made of the same material (same form and same density). Alternatively, they can be made of materials that are different, but are able to perform identical deformations at equal injected charge.

The electrode layers 2, 3 can be of any conductive material able to intercalate ions, or somehow vary their dimensions under the action of charge injection. In the context of the present invention, said material is called "active material", since it converts the accumulation of charges into a deformation, and hence into a movement. Examples of active materials for the electrode layers comprise multiwalled carbon nanotubes (MWCNT), double-walled carbon nanotubes (DWCNT), or single-walled carbon nanotubes (SWCNT), chemically modified carbon nanotubes, also in the form of buckypaper, bucky gel, or graphene, graphite, carbon black or the aforementioned materials in the form of composites with polymers; carbon composites derived from carbides, conductive polymers such as polypyrrole (PPy), polyaniline (PANI), polyethylenedioxythiophene (PEDOT), poly (3-methylthiophene) (pMeT), etc., and porous metal electrodes.

Actuator 1 further comprises a solid polymer electrolyte layer 4 interposed between the first and the second electrode 2, 3. Said solid polymer electrolyte layer 4 is electrically insulating and ionically conductive. The solid electrolyte can be any electrically insulating and ionically conductive material made using ionically conductive plastics or any plastic mixed with a salt (solid or liquid) in various compositions or gel, such as agarose, containing salts. The salts can moreover be dissolved in any high-boiling solvent and can be trapped in the polymer matrix in the form of a solution. Said materials are generally referred to by the term solid polymer electrolyte (SPE).

Examples of ionically conductive polymers for the solid electrolyte comprise NAFION®, FLEMION®, sulphonated polyether ether ketones (SPEEK), sulphonated polysulphones and other sulphonated polymers or others bearing functional groups able to exchange ions.

Examples of polymers for the solid polymer electrolyte that need to be mixed with a salt comprise polyvinylidene fluoride (PVdF), poly(vinylidene fluoride-hexafluoropropylene) (P(VdF-HFP), poly(vinylidene fluoride-tetrafluoroethylene) (P(VdF-TFE)), poly(vinylidene fluoride-trifluoroethylene) (P(VdF-TrFE)), polymethyl methacrylate (PMMA), polyvinyl chloride (PVC), polyacrylonitrile (PAN), PVC/PAN blends, polyhydroxyethyl methacrylate (PHEMA), poly (ethylene oxide) (PEO) and polymers based on styrene/divinylbenzene.

Examples of salts for the solid polymer electrolyte comprise any salt at a concentration such as to obtain sufficient ionic conductivity ($10^{-6}$ S/cm or higher) in the composite. A particular example consists of ionic liquids based on imidazole, which are liquid at room temperature. Other examples of ionic liquids that can be used comprise piperidinium salts, pyrrolidinium salts and quaternary ammonium salts.

Actuator 1 further comprises a passive electrode 5 immersed in the solid polymer electrolyte layer 4 so as to be electrically insulated relative to the first and to the second electrode layer 2, 3.

The term "passive electrode" means, for the purposes of the present invention, that the electrode 5 is not itself able to produce a deformation, i.e. does not produce any motive work (from a mechanical standpoint, the passive electrode behaves substantially like the solid polymer electrolyte layer 4). This passive electrode 5 is therefore of electrically conductive and elastically deformable material, so as to mechanically comply with the deformations of actuator 1 induced by the dimensional changes of the first and of the second electrode layer 2, 3. Examples of materials for the passive electrode comprise coil or spiral metal springs, carbon-coated coil or spiral metal springs; conductive elastomers, conductive LYCRA® fibres, conductive polymers with appropriate ion doping or conductive composites. The passive electrode can also be obtained by implantation of metal ions in the solid polymer electrolyte layer.

Figure 2:
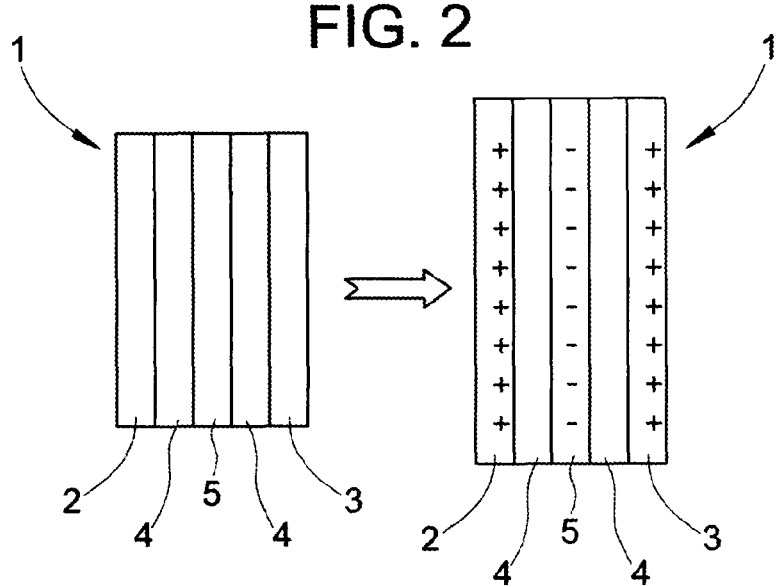
FIGS. 2 to 5 show the actuator of FIG. 1 in different operating conditions.

With the actuator described above, it is possible to obtain a linear movement (in a direction perpendicular to the direction of stratification of the actuator) by connecting the first and the second electrode layer 2, 3 together and using the passive electrode 5 as counter-electrode. For example, by polarizing the first and second electrode layer 2, 3 positively and the passive electrode 5 negatively, an axial displacement is obtained, as shown in FIG. 2.

Figure 3:
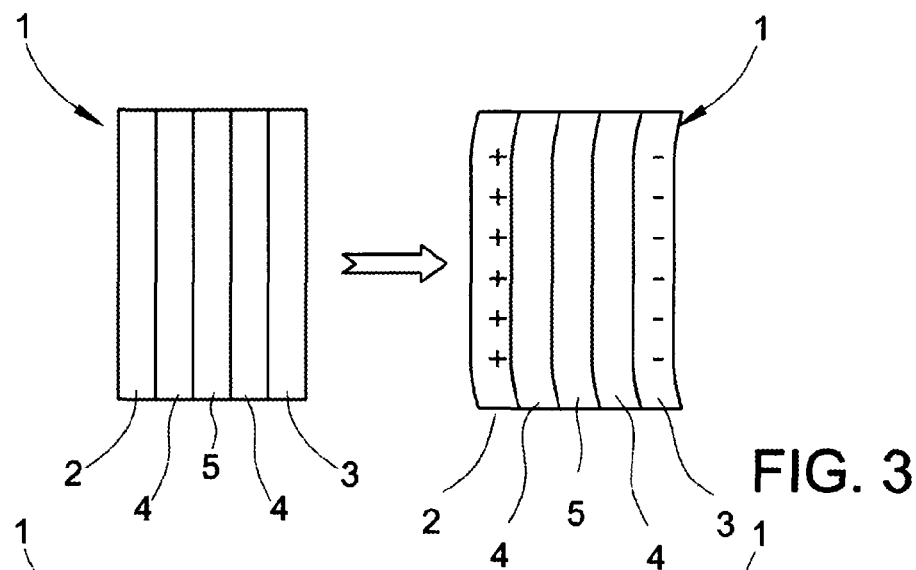
Figure 4:
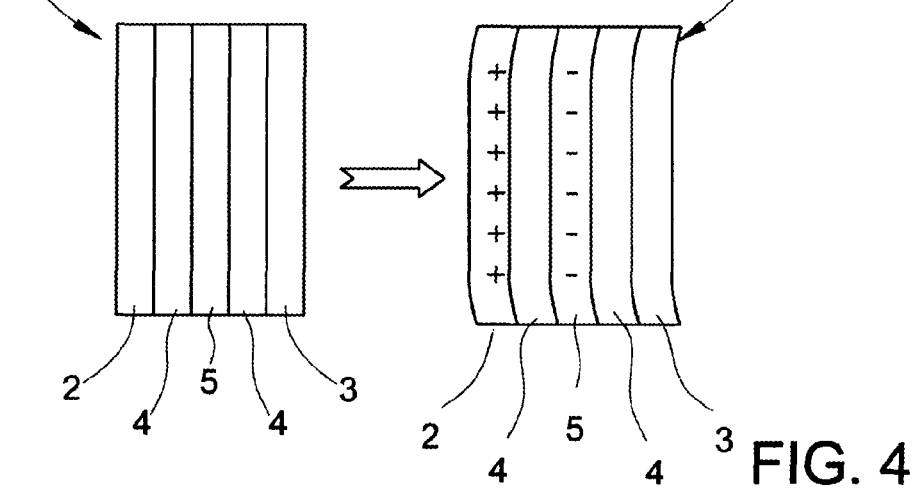

It is also possible to obtain a bending movement (with cylindrical curvature, in which the directrices of the cylinder are perpendicular to the direction of linear deformation), using two different configurations; this can be done using one of the electrode layers 2, 3 as working electrode and the other as counter-electrode, or using one of the electrode layers 2, 3 as working electrode and the passive electrode as counter-electrode. For example, by polarizing the first electrode layer 2 positively and the second electrode layer 3 negatively (FIG. 3), or by polarizing the first electrode layer 2 positively and the passive electrode 5 negatively (FIG. 4), a flexural displacement is obtained. As can be seen in FIGS. 3 and 4, actuator 1 is curved to provide concavity on the side opposite to the positively charged layer. Bending in the opposite direction is obtained by reversing the polarity of the electrodes.

Figure 5:
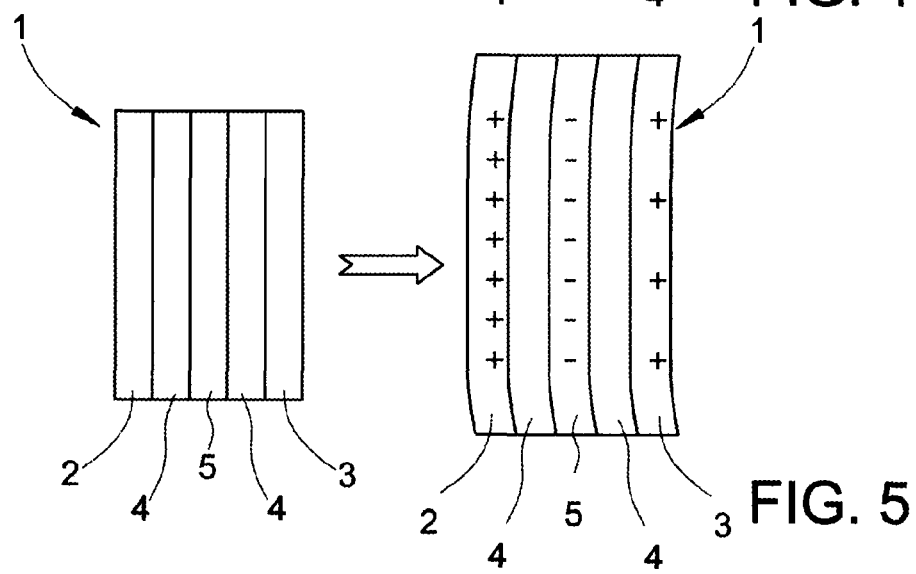

It is moreover possible for the actuator to have a linear deformation (of elongation or of contraction) and simultaneously bending. This can be obtained by polarizing the two electrode layers 2, 3 with different values of charge and the passive electrode with polarization opposite to that of the electrode layers (FIG. 5). Bending in the opposite direction is obtained by reversing the polarity of the electrodes.

In principle, the passive electrode should have a capacity as high as possible to benefit best from the charge transfer capacity of the active material of the electrode layers. In charging/discharging of the device, the two different materials of the electrode layers 2, 3 and of the passive electrode 5 have different potential excursions, and for this type of device it is desirable for the electrode layers 2, 3 to have the maximum possible excursion.

For example, consider an actuator of 20 mm×4 mm×0.2 mm, in which the electrode layers 2, 3 are composed of bucky gel, and the passive electrode 5 is composed of a copper spring. The typical capacity for each electrode of bucky gel is 0.03 F, therefore the total capacity for the two electrodes is 0.06 F. The capacity for the Cu spring is 0.004 F. If a potential difference of 2V is applied between two electrodes, it is found that, relative to the open circuit voltage, the semipotentials of the two electrodes vary according to the equation $C^+\Delta V^+ = C^- \Delta V^-$.

If the open circuit voltage is 0V (typically 10-20 mV for the materials under consideration), the change in potential for the electrodes of bucky gel is only 0.125 V, whereas the change in semipotential for the passive electrode is 1.875 V. An actuator with maximized variation of semipotential of the electrode layers 2, 3 should have improved properties of actuation. This can be obtained for example by applying a layer of carbon with high capacity on the metal spring or by coating it with a material capable of having very quick faradaic reactions (pseudo-capacitive) such as ruthenium oxide [6] or by making the spring using a material with increased surface area (for example a porous metal) [7].

One embodiment of the device envisages electrode layers of bucky gel that include 19 wt. % of SWCNT, 40 wt. % of polyvinylidene fluoride (PVdF) and 41 wt. % of 1-butyl-3-methylimidazole tetrafluoroborate (BMIM-$BF_4$), while the solid electrolyte layer contains 50 wt. % of BMIM-$BF_4$ and 50 wt. % of PVdF.

More generally, the preferred ranges of composition for the active electrode layers are as follows (proportions by weight): 0-50% of ionic liquid, 0-50% of supporting polymer and the remainder by weight of active material for the electrode. For the solid electrolyte layer it is preferred to have an ionic liquid/polymer weight ratio from 10:1 to 1:10 or such as to attain a value of ionic conductivity equal to at least $10^{-6}$ S/cm.

The mixtures were prepared as follows: for the electrodes, BMIM-$BF_4$ was ground with CNT in an agate vessel; next, a solution having a concentration of 7 mg/ml of PVdF in dimethyl acetamide (DMAc) was added, and the resultant mixture was stirred for one hour. Alternatively, the gel can be obtained by sonication with a probe, a jet mill, etc. Alternative solvents that can be used include dimethylformamide (DMF), methyl pentanone, tetrahydrofuran (THF), 1-methyl-2-pyrrolidone (NMP) etc.

For the electrolyte, PVdF was dissolved in DMAc with magnetic stirring and, after adding BMIM-$BF_4$, the solution was stirred for about 3 hours. Alternatively, other solvents can be used, such as those mentioned above.

The electrode layers can be deposited by various techniques, including casting, rolling, moulding, spraying and filtration. In particular, for casting it is preferable to use DMAc and evaporate the solvent in the temperature range 45-100° C. For spraying it is preferable to use 4-methyl-2-pentanone as solvent.

When the passive electrode is of a metallic material, it could be prepared by shaping a metal film in the desired shape, for example a coil or spiral shape.

One method of manufacture of the actuator envisages deposition by casting, layer by layer, of the solid polymer electrolyte layer and of the electrode layers on the passive electrode.

Another method envisages deposition by casting of the solid polymer electrolyte layer on the passive electrode, and then application of the electrode layers by spraying.

A further method envisages making the solid polymer electrolyte layer on the passive electrode by dip-coating, and then application of the electrode layers by spraying or by casting.

The carbon nanotubes can be modified chemically to achieve greater efficiency in transfer of stresses, in deformation and in frequency response. An example of chemical modification is as follows.

Pure SWCNT (p-SW) were oxidized by treatment with 6 M nitric acid under reflux for 4 hours; this oxidation process is used for creating oxidized sites (principally carboxyl groups, —COOH) on the surface of the nanotubes. The product, designated SW-COOH, was collected by filtration on a polycarbonate membrane, washed thoroughly with ultrapure water and dried overnight under dynamic vacuum at 80° C.

The carboxyl groups on carbon nanotubes can easily be converted to acyl chloride groups (—COCl) by treatment with thionyl chloride. SW-COOH was converted to SW-COCl by reflux in $SOCl_2$ for 16 hours (concentration of CNT in $SOCl_2$ equal to 2 mg/ml). The resultant material was then dried in $N_2$ atmosphere at 120° C. for six hours and resuspended in DMF. The percentage of carboxyl functionalities after this treatment was 3%, and was assessed by a titration method followed by back-titration of the conjugated base SW-COOH—$Na^+$; this procedure is described in detail in the literature [4].

Then 10 ml of 0.0167 M solution of poly-p-phenylene diamine (PPD) in DMF was added dropwise, under a stream of $N_2$, to 40 ml of 5 mg/ml of CNT in DMF, and the mixture was stirred under reflux for 48 hours. The product, SW-amide, was collected by filtration on a PTFE membrane and was washed thoroughly with DMF. The amount of PPD was selected to be comparatively lower, to guarantee that all the amino groups react to form cross-links between the tubes. The dispersibility of this product is less than that of the CNT; the product can however easily be incorporated in a gel formed using ionic liquids and PVdF.

Figure 6:
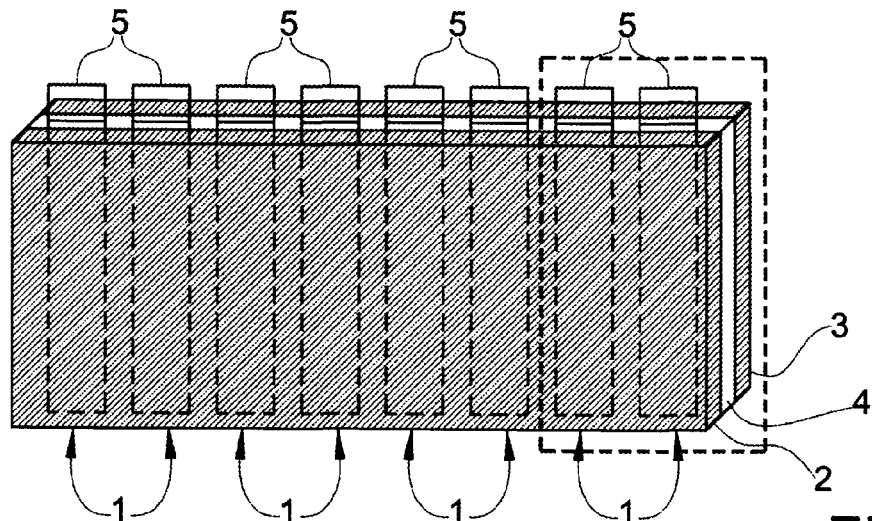
FIGS. 6 to 8 are schematic representations of complex actuators formed by combining units of actuators according to FIG. 1.
Figure 7:
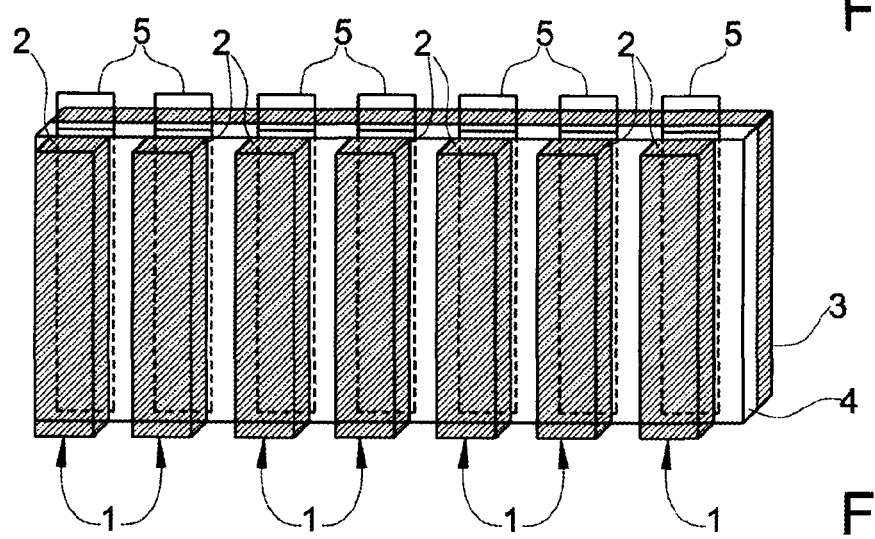
Figure 8:
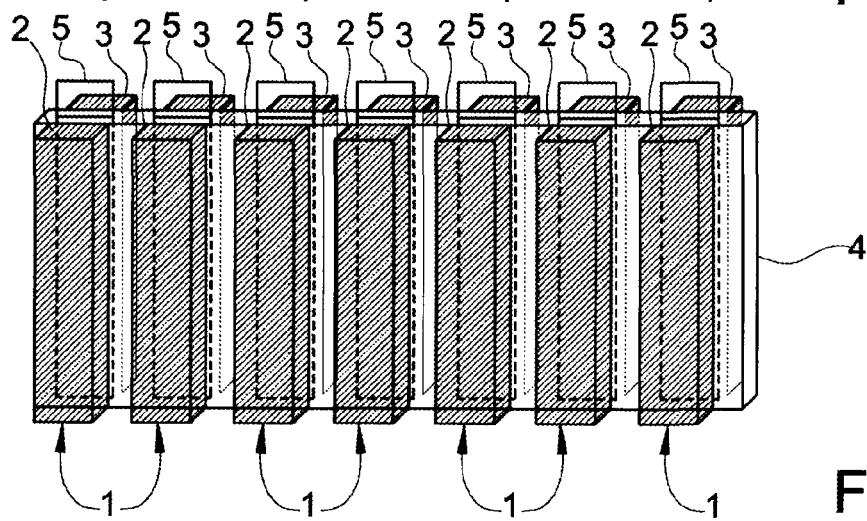

It is possible to obtain complex movements of deformation using a certain number (at least 2) of units of actuator, as illustrated in FIG. 1. Examples of configurations that can be obtained are shown in FIGS. 6 to 8. As can be seen in these figures, in each of the actuators represented there is a plurality of passive electrodes 5, which are immersed in the same solid polymer electrolyte layer 4.

The example in FIG. 6 shows a complex actuator formed from a plurality of units of actuator 1 arranged side by side, in which the units 1 share the same first electrode layer 2, the same second electrode layer 3, and the same solid polymer electrolyte layer 4, whereas the respective passive electrodes 5, positioned side by side, are separated and isolated from one another and from the first and second electrode layer (the dashed line indicates the case of simpler multiple configuration, with a number of passive electrodes equal to 2).

The example in FIG. 7 shows a complex actuator formed from a plurality of units of actuator 1 arranged side by side, in which the units 1 share the same second electrode layer 3 and the same solid polymer electrolyte layer 4, while the respective first electrode layers 2, side by side, and the passive electrodes 5, side by side, are separated and isolated from one another and from the second electrode layer.

The example in FIG. 8 shows a complex actuator formed from a plurality of units of actuator 1 arranged side by side, in which the units 1 share the same solid polymer electrolyte layer 4, while the respective first electrode layers 2, the second electrode layers 3 and the passive electrodes 5 are separated and isolated from one another.

The solutions in FIGS. 6 to 8 make it possible to apply, to the units 1, a local potential difference (or gradient) of the same polarity. These configurations make it possible to add further directions of displacement to the device, i.e. the actuator can expand/contract, bend and deform in various directions. For example, in the case of the scheme in FIG. 7, if an actuator is used in which the number of passive electrodes is equal to 2, another direction of deformation is obtained for the three configurations of deformation in FIGS. 3 to 5. This can be obtained by polarizing the passive electrodes with different values of charge. Further possibilities of deformation can be obtained by arranging a larger number of passive electrodes, which can be polarized with different values of charge.

In the configurations in FIGS. 7 and 8, the number of first electrode layers and/or of second electrode layers is also greater than 1. Using a suitable configuration of elements, it is therefore theoretically possible to obtain deformations in any direction.

REFERENCES

[1] Ding J, et al., *Synthetic metals,* 2003, 138: 391
[2] Fukushima T, et al., *Science,* 2003, 300: 2072
[3] Fukushima T, et al., *Angew. Chem.,* 2005, 117: 2410
[4] Terasawa N, et al., *Sens. Act. B,* 2009, 139: 624
[5] Baughman R H, et al., *Science,* 1999, 284: 1340
[6] Yoon Y S, et al., *Journal of Power Sources,* 2001, 101: 126
[7] Marrese C A, *Anal. Chem.,* 1987, 59: 217

The invention claimed is:

1. A polymeric actuator comprising:
a first electrode layer and a second electrode layer both containing an electrically conductive material and able to change size along at least one direction of deformation as a result of charge injection or ion intercalation, and
a solid polymer electrolyte layer interposed between said first electrode layer and said second electrode layer, wherein said solid polymer electrolyte layer is an electrical insulator and a ionic conductor,
wherein said actuator is able to alter its shape as a result of dimensional changes of said first and second electrode layers,
a passive electrode immersed in the solid polymer electrolyte layer to be electrically insulated with respect to said first and second electrode layers, wherein said passive electrode is made of electrically conductive and elastically deformable material, to mechanically comply with deformations of the actuator induced by the dimensional changes of said first and second electrode layers,
wherein said actuator has the ability of assuming different deformation configurations in response to corresponding polarization configurations of said first and second electrode layers and of the passive electrode.

2. Actuator according to claim 1, wherein the deformation configurations comprise linear motion, bending and combination of linear motion and bending.

3. Actuator according to claim 1, wherein said first and second electrode layers are composed of a material selected from the group consisting of: multi walled carbon nanotubes (MWCNT), double walled carbon nanotubes (DWCNT), or single walled carbon nanotubes (SWCNT), chemically modified carbon nanotubes, buckypaper, bucky gel, or graphene, graphite, carbon black or the materials in the form of composites with polymers; carbide derived carbon composites, intrinsecally conductive polymers including polypyrrole (PPy), polyaniline (PANI), poly(3,4-ethylenedioxythiophene)(PEDOT), poly (3-methylthiphene) (pMeT), porous metal electrodes.

4. Actuator according to claim 1, wherein said solid polymer electrolyte layer is composed of at least one ionic conductive polymer or of a mixture of at least one polymer and one salt.

5. Actuator according to claim 4, wherein the ionic conductive polymer of the solid polymer electrolyte layer is selected from the group consisting of: NAFION®, FLEMION®, sulfonated poly(ether ether ketone)(SPEEK), sulfonated polysulfones and other sulfonated polymers or carrying moieties able to exchange ions.

6. Actuator according to claim 4, wherein the polymer for the solid polymer electrolyte, which needs to be mixed with a salt in order to be ionic conductive, is selected from the group consisting of: polyvinylidene fluoride (PVdF), poly(vinylidene fluoride-co-hexafluoropropene)(P(VdF-HFP), poly (vinylidene fluoride-tetrafluoroethylene) (P(VdF-TFE)), poly(vinylidene fluoride-trifluoroethylene) (P(VdF-TrFE)), poly(methyl methacrylate) (PMMA), polyvinyl chloride (PVC), poly acrylic nitrile (PAN), mixtures PVC/PAN, poly (2-hydroxyethyl methacrylate) (PHEMA), polyethylene oxide (PEO) and polymers based on styrene/divinylbenzene.

7. Actuator according to claim 4, wherein the salt of the solid polymer electrolyte layer is an ionic liquid based on imidazolium, piperidinium, pyrrolidinium and quaternary ammonium salts.

8. Actuator according to claim 1, wherein said first and second electrode layers are made of 0-50% in weight of ionic liquid, 0-50% in weight of polymer and the remaining portion in weight of active material for the electrode, and wherein said solid polymer electrolyte layer is composed of an ionic liquid and at least a polymer, with a weight proportion in ionic liquid/polymer from 10:1 to 1:10 or such that said solid polymer electrolyte layer may reach an ionic conductivity value of at least $10^{-6}$ S/cm.

9. Actuator according to claim 1, wherein said passive electrode is selected from the group consisting of: helical or spiral metallic springs, carbon coated helical or spiral metallic springs; conductive elastomers, LYCRA® conductive fibres, ionically doped conductive polymers; metal ions implanted in the solid polymer electrolyte layer.

10. Actuator according to claim 1, which comprises a plurality of said passive electrodes placed side by side and immersed into the solid polymer electrolyte layer to be electrically insulated between each other and with respect to said first and second electrode layers.

11. Actuator according to claim 10, further comprising a plurality of said first electrode layers placed side by side and/or a plurality of said second electrode layers placed side by side, which are placed to be electrically insulated between each other.

* * * * *